United States Patent [19]

Seevinck et al.

[11] Patent Number: 4,857,861
[45] Date of Patent: Aug. 15, 1989

[54] AMPLIFIER ARRANGEMENT WITH IMPROVED QUIESCENT CURRENT CONTROL

[75] Inventors: Evert Seevinck, Eindhoven; Willem De Jager, Enschede; Buitendijk, Nijmegen, all of Netherlands

[73] Assignee: U. S. Philips Corporation, New York, N.Y.

[21] Appl. No.: 162,921

[22] Filed: Mar. 2, 1988

[30] Foreign Application Priority Data

Sep. 23, 1987 [NL] Netherlands .................... 8702262

[51] Int. Cl.$^4$ ............................................. H03F 3/45
[52] U.S. Cl. ..................................... 330/255; 330/260
[58] Field of Search ............... 330/252, 255, 259, 260, 330/261, 262, 270, 271

[56] References Cited

U.S. PATENT DOCUMENTS

4,746,877  5/1988  Siegel .................................. 330/255

Primary Examiner—Gene Wan
Attorney, Agent, or Firm—Marianne R. Rich

[57] ABSTRACT

The first ($T_1$) and the second ($T_2$) output transistor of an amplifier arrangement are push-pull driven by means of a drive circuit (10) having two transistors ($T_{11}$, $T_{12}$) which are each loaded by a current source ($T_{13}$, $T_{14}$). Currents which are a measure of the currents flowing through the first ($T_1$) and the second ($T_2$) output transistor are generated by first (20) and second (30) current measuring means. These currents are applied to a control circuit (40) which controls the current intensity of the current sources ($T_{13}$, $T_{14}$) in such a way that the harmonic mean value of the currents flowing through the first ($T_1$) and the second ($T_2$) output transistor is substantially equal to a reference value.

11 Claims, 4 Drawing Sheets

AMPLIFIER ARRANGEMENT WITH IMPROVED QUIESCENT CURRENT CONTROL

BACKGROUND OF THE INVENTION

1. Field of the Invention

The related art includes an amplifier arrangement described in European Patent Application EP-A-0,217,431, which includes:

a first and a second output transistor of the same conductivity type, each having a first main terminal, a second main terminal and a control terminal, the first and the second main terminal of the first output transistor being coupled to a first power supply terminal and an output for connecting a load and the first and the second main terminal of the second transistor being coupled to the output and a second power supply terminal, drive means for driving the first and the second transistor in phase opposition, said drive means having a first input for applying an input signal, a second input, a first output which is coupled to the control terminal of the first transistor and to a power supply terminal by means of a first current source, and a second output which is coupled to the control terminal of the second transistor and to the power supply terminal by means of a second current source, quiescent current means for causing a quiescent current to flow through the first and the second output transistor, said quiescent current means having first and second current measuring means for generating a first and a second measuring current which are a measure of the current flowing through the first and the second output transistor, respectively, and having feedback means for controlling the quiescent current flowing through the first and the second output transistor by way of the first and the second measuring current.

In the description and the appendent claims the first main terminal, the second main terminal and the control terminal are identical to the drain, the source and the gate, respectively, in the case of unipolar transistors and are identical to the collector, the emitter and the base, respectively, in the case of bipolar transistors.

An amplifier arrangement of this type can be generally used as an output amplifier arrangement and is particularly suitable as an output amplifier in audio circuits.

The first and the second output transistor are push-pull driven by the non-inverting and the inverting output, respectively, of a voltage-to-current converter which has a non-inverting input to which the input voltage is applied and an inverting input which is connected to the output of the amplifier arrangement.

The amplifier arrangement is of the class AB type because a given quiescent current flows through the two output transistors. The means for adjusting the value of this quiescent current comprises a measuring circuit for each of the two output transistors for measuring the current through the relevant output transistor. This measuring current is converted across a first diode into a voltage which is applied to the inverting input of an amplifier. A reference voltage generated across a second diode is applied to the non-inverting input thereof. In the absence of an input signal to drive the output transistors, the output of the amplifier controls the relevant output transistor in such a way that the voltage at the inverting input of this amplifier will become equal to the reference voltage. When driving one of the two output transistors, the quiescent current through the driven transistor decreases and the current through the non-driven transistor increases. The known arrangement is, however, adapted in such a way that this increase cannot prevent the non-driven transistor from being fully turned off. If the relevant transistor is subsequently driven, it should first be turned on, which causes cross-over distortion.

SUMMARY OF THE INVENTION

It is therefore an object of the invention to provide an amplifier arrangement having an improved quiescent current control. According to the invention, an amplifier arrangement of a type described in the opening paragraph is characterized in that the second input of the drive means is coupled to a point for conveying a reference potential and the negative feedback means are provided with a control circuit for controlling the current intensities of the first and the second current source in order to render the harmonic mean value of the first and the second measuring current substantially equal to a reference value.

The control circuit causes the quiescent current through the non-driven transistor to be controlled to a substantially constant value, which keeps this transistor conducting independent of the extent to which the other output transistor is driven. This prevents the one output transistor from being turned off when the other output transistor is fully turned on. Consequently, the cross-over distortion caused thereby is considerably reduced.

In a first embodiment of an amplifier arrangement according to the invention, a suitable control circuit maintaining the harmonic means value of the two measuring currents substantially constant may be characterized in that the control circuit comprises:

a first differential amplifier having a third and a fourth transistor of the first conductivity type, each having a first main terminal, a second main terminal and a control terminal, the second main terminals being coupled to a common point which is coupled to the second power supply terminal by means of a third current source, the control terminal of the third transistor being coupled to the first power supply terminal by means of a first diode and to a first input for applying the first measuring current, and the control terminal of the fourth transistor being coupled to the first power supply terminal by means of a second diode and to a second input for applying the second measuring current, a reference circuit having a fourth current source which is coupled to the first power supply terminal by means of a third and a fourth diode and a second differential amplifier having a fifth and a sixth transistor of a second conductivity type, each having two first main terminals, at least one second main terminal and a control terminal, the control terminal of the fifth transistor being coupled to the third current source and the control terminal of the sixth transistor being coupled to the common point of the first differential amplifier, the two first main terminals of the fifth transistor constituting outputs of the first and the second current source.

A second embodiment of an amplifier arrangement may be characterized in that the first current measuring means include a seventh transistor having a first main terminal, a second main terminal and a control terminal, the control terminal and the second main terminal being coupled to the control terminal and the second main terminal, respectively, of the first transistor and in that the second current measuring means include an eighth transistor having a first main terminal, a second main terminal and a control terminal, the control terminal and the second main terminal being coupled to the control terminal and the second main terminal, respectively, of the second output transistor. This embodiment may be further characterized in that the second main terminal of the seventh transistor is coupled to the second main terminal of the first transistor by means of a first resistor and in that the second main terminal of the eighth transistor is coupled to the second main terminal of the second transistor by means of a second resistor. The first and the second resistor limit the maximum current through the seventh and the eighth transistor, which prevents these transistors from damage when the output transistors are fully turned on.

A third embodiment of an amplifier arrangement according to the invention may be characterized in that the drive means include a third differential amplifier having a ninth and a tenth transistor each having a first main terminal, a second main terminal and a control terminal, the control terminal and the first main terminal of the ninth transistor being coupled to the first input and the first output, respectively, of the drive means and the control terminal and the second main terminal of the tenth transistor being coupled to the second input and the second output, respectively, of the drive means. This embodiment may be further characterized in that the first input of the drive means is coupled to an input of an eleventh transistor arranged as a voltage follower, an output of which is coupled to the second output of the drive means by means of a second capacitor. The first capacitor ensures a frequency compensation for obtaining a stable gain and the second capacitor ensures a direct signal transmission to the control terminal of the second output transistor in the case of high frequencies.

A fourth embodiment of an amplifier arrangement according to the invention may be characterized in that the first output of the drive means is coupled to a non-inverting input of an amplifier an inverting input of which is coupled to the output of the amplifier arrangement and an output of which is coupled to the control terminal of the first output transistor. This amplifier constitutes a negative feedback from the output to the control terminal of the first output transistor so that the non-linearities caused by this transistor are reduced.

In another embodiment this amplifier may be characterized in that it is constituted by a fourth differential amplifier having a twelfth and a thirteenth transistor of the first conductivity type, each having a control terminal and a first and a second main terminal, the control terminal of the twelfth transistor being coupled to the non-inverting input and the control terminal of the thirteenth transistor being coupled to the inverting input, the first main terminal of the thirteenth transistor being coupled to the output of the amplifier and to the first power supply terminal by means of a current source.

Yet another embodiment may be characterized in that the first output of the drive means is coupled to an input of a transistor arranged as a voltage follower, an output of which is coupled to the control terminal of the first output transistor by means of a third capacitor. At high frequencies the third capacitor ensures a direct signal transmission from the drive means to the control terminal of the first output transistor and thereby compensates the phase shift occurring in the amplifier at high frequencies.

BRIEF DESCRIPTION OF THE DRAWINGS

The invention will now be described in greater detail by way of example with reference to the accompanying drawings in which.

DESCRIPTION OF THE PREFERRED EMBODIMENTS

Figure 1:
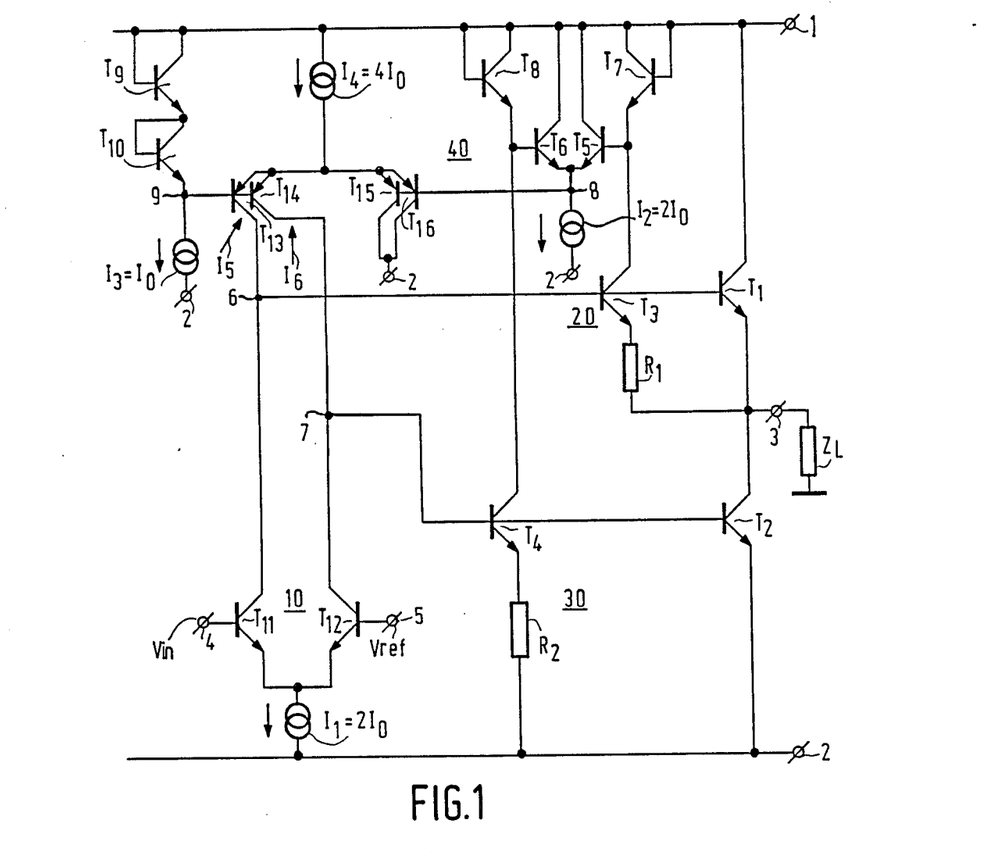
FIG. 1 shows a first embodiment of an amplifier arrangement according to the invention.

FIG. 1 shows a first embodiment of an amplifier arrangement according to the invention. The arrangement comprises a first output transistor $T_1$ and a second output transistor $T_2$ whose collector-emitter paths are arranged in series between a first power supply terminal 1 and a second power supply terminal 2. The emitter of transistor $T_1$ and the collector of transistor $T_2$ are connected to an output 3 of the amplifier arrangement to which a load $Z_1$ is connected.

The amplifier arrangement also comprises drive means 10 for push-pull driving of the first and the second output transistor $T_1$, $T_2$. The drive means 10 comprise a differential amplifier having two transistors $T_{11}$ and $T_{12}$ whose emitters are connected to a common point which is connected to the power supply terminal 2 by means of a current source $I_1 = 2I_0$. The base of transistor $T_{11}$ is connected to a first input 4 to which an input voltage $V_{in}$ is applied. The base of transistor $T_{12}$ is connected to a second input 5 conveying a reference voltage $V_{ref}$. The collector of transistor $T_{11}$ is connected to a first output 6 which is coupled to the base of transistor $T_1$ and to the collector of transistor $T_{13}$ constituting a variable current source $I_5$. Similarly, the collector of transistor $T_{12}$ is connected to a second output 6 which is coupled to the base of transistor $T_2$ and is connected to the collector of a transistor $T_{14}$ constituting a variable current source $I_6$.

The current sources $I_5$ and $I_6$ form part of quiescent current means for causing a quiescent current to flow through the output transistors $T_1$ and $T_2$ in order to obtain a class AB adjustment of the amplifier arrangement. These quiescent current means have first current measuring means 20 which are constituted by a transistor $T_3$ whose base-emitter junction is arranged in series with a first resistor $R_1$ parallel to the base-emitter junction of transistor $T_1$. The collector current of transistor $T_3$ is a measure of the collector current of transistor $T_1$ and is determined by the ratio of the emitter surfaces of the transistor $T_1$ and $T_3$ and the resistance of resistor $R_1$. In order to minimize the dissipation of the arrangement, the emitter surface of the transistor $T_3$ is preferably chosen to be much smaller than that of transistor $T_1$. The resistor $R_1$ limits the maximum current through transistor $T_3$ to a safe value so as to prevent this transistor from being damaged when transistor $T_1$ is fully turned on. It is to be noted that the resistor $R_1$ may in principle be dispensed with. The quiescent current means also comprise second current measuring means 30 which are similarly provided with a transistor $T_4$ whose base-emitter junction in series with a resistor $R_2$ is arranged parallel to the base-emitter junction of transistor $T_2$. The collector current of transistor $T_4$ is a measure of the current flowing through transistor $T_2$. The quiescent current means also comprise a control circuit 40 which keeps the harmonic mean value of the measuring currents supplied by the first and second measuring means 20 and 30 substantially equal to a reference value. The control circuit 40 comprises a first differential amplifier having two transistors $T_5$ and $T_6$ whose emitter are connected to a common point 8 which is connected to the second power supply terminal 2 by means of a current source $I_2=2I_0$. The base of transistor $T_5$ is connected to the first power supply terminal via a transistor $T_7$ arranged as a diode and to the collector of transistor $T_3$. Similarly the base of transistor $T_6$ is connected to the first power supply terminal 1 via a transistor $T_8$ arranged as a diode and to the collector of transistor $T_4$. The control circuit 40 also comprises a reference circuit which is constituted by a current source $I_3=I_0$ whose output 9 is connected to the first power supply terminal 1 via two series-arranged transistor $T_9$ and $T_{10}$ arranged as diodes. The control circuit 40 also comprises a second differential amplifier having two transistors $T_{13}$ and $T_{14}$ whose base-emitter junctions are arranged in parallel and two transistors $T_{15}$ and $T_{16}$ whose base-emitter junctions are also arranged in parallel. The emitters of the transistors $T_{13}$–$T_{16}$ are connected to a common point which is connected to the positive power supply terminal 1 by means of a current source $I_4=4I_0$. The common base of the transistors $T_{15}$ and $T_{16}$ is connected to the point 8 of the differential amplifier $T_5$, $T_6$. The collectors of the transistors $T_{15}$ and $T_{16}$ are connected to the second power supply terminal 2. The common base of the transistors $T_{13}$ and $T_{14}$ is connected to the output 9 of current source $I_3$. The collector of transistor $T_{13}$ is connected to the first output 6 and the collector of transistor $T_{14}$ is connected to the second output 7 of the drive means 10. Transistor $T_{13}$ constitutes a current source $I_6$.

It is to be noted that the transistors $T_{13}$ and $T_{14}$ as well as the transistors $T_{15}$ and $T_{16}$ may be replaced by one single transistor having a double collector.

The operation of the arrangement may be explained as follows. In the control circuit 40 a first translinear loop can be distinguished which is constituted by the transistors $T_5$–$T_8$. The following relation holds for this loop:

$$V_{BET7}+V_{BET5}=V_{BET8}+V_{BET6} \quad (1)$$

in which $V_{BE}$ is the base-emitter voltage of the relevant transistor. By means of the known exponential relation between the base-emitter voltage and the collector current of a transistor and the assumption that the transistors $T_5$–$T_8$ have identical emitter surfaces, this equation results in:

$$I_{S1}.I_0(1-a)=I_{S2}.I_0(1+a) \quad (2)$$

in which $I_{S1}$=the first measuring current flowing through transistor $T_7$ and being supplied by the first measuring means 20, $I_{S2}$=the second measuring current flowing through transistor $T_8$ and being supplied by the second measuring means 30 and $a$=the signal current through the transistors $T_5$ and $T_6$ determined by a difference in the first and the second measuring current $I_{S1}$ and $I_{S2}$.

It follows from this equation that $$\frac{I_{S2}}{I_{S1}}\frac{1+a}{1-a} \text{ or } a=\frac{I_{S2}-I_{S1}}{I_{S2}+I_{S1}} \quad (3)$$

In this control circuit 40 a second translinear loop may also be distinguished which is constituted by the transistors $T_8$, $T_6$, $T_{16}$, $T_{13}$, $T_{10}$ and $T_9$. The following equation holds for this loop:

$$V_{VET8}+V_{BET6}+V_{BET13}=V_{BET9}+V_{BET10}+V_{BET16} \quad (4)$$

By means of the known exponential transistor equation and again assuming that the transistors have identical emitter surfaces, this equation results in:

$$I_{S1}.I_0(1+a).I_0(1+Z)=I_0^2.I_0(1-Z) \quad (5)$$

in which $Z$=the signal current through the transistors $T_{13}$ and $T_{16}$ determined by a voltage difference between the bases 8 and 9.

It follows that:

$$I_0 \cdot \frac{1-Z}{1+Z} = I_{S1}(1+a) \quad (6)$$

Filling in equation 3, this results in:

$$I_0 \cdot \frac{1+Z}{1-Z} \frac{2I_{S1} \cdot I_{S2}}{I_{S1}+I_{S2}} \quad (7)$$

or:

$$Z = \frac{I_0(I_{S1}+I_{S2}) - 2I_{S1} \cdot I_{S2}}{I_0 \cdot (I_{S1}+I_{S2}) + 2I_{S1} \cdot I_{S2}} \quad (8)$$

The collector current of transistor $T_{13}$ is therefore equal to $I_5=I_0(1+Z)$. Since transistor $T_{14}$ is arranged in parallel with transistor $T_{13}$, the collector current of transistor $T_{14}$ is also equal to $I_6=I_0(1+Z)$.

In the absence of an input voltage $V_{in}$ at the input 4 of the drive means 10 a current $2I_0$ of current source $I_1$ will be evenly distributed over the transistors $T_{11}$ and $T_{12}$ so that a direct current $I_0$ flows through each of these transistors. These direct currents are compensated by the direct currents $I_0$ which flow through the transistors $T_{13}$ and $T_{14}$. Consequently, a current $Z$ flows via output 6 to the base of transistor $T_1$ and an equally large current $Z$ flows via output 7 to the base of transistor $T_2$. A quiescent current resulting $a$ in a first and an equal second measuring current $I_{S1}$ and $I_{S2}$ will therefore flow through transistors $T_1$ and $T_2$. The transistors $T_1$ and $T_2$ are now driven in such a way that the voltage at the point 8 determined by these measuring currents is equal to the reference voltage at the point 9. For the value of the quiescent current flowing through transistors $T_1$ and $T_2$ the following applies. The current gain factors of the transistors $T_1$ and $T_2$ are very large. This means that the base currents Z are very small and may be assumed to be approximately zero. With $I_{S1}=I_{S2}$ it follows from equation 8 for the measuring currents flowing in the absence of an input voltage $V_1$ that:

$$I_{S1}=I_{S2}=I_0 \qquad (9)$$

For relatively small currents the voltage across the resistors $R_1$ and $R_2$ is small with respect to the base-emitter voltages of the transistors $T_3$ and $T_4$. For a ratio of base-emitter surfaces of the transistors $T_1$, $T_3$ and $T_2$, $T_4$ which is equal to N it holds for the value of the quiescent currents flowing through the transistors $T_1$ and $T_2$ that:

$$I_1=I_2=NI_0 \qquad (10)$$

In the case of an input voltage $V_{in}$ at the input 4 which is, for example, smaller than the reference voltage $V_{ref}$ at the input 5, the current through transistor $T_{12}$ increases and the current through transistor $T_{11}$ decreases. Consequently the base current of transistor $T_1$ increases and that of transistor $T_2$ decreases to that transistor $T_1$ is further turned on and transistor $T_2$ is further turned off. As a result, the measuring current $I_{S1}$ through transistor $T_3$ increases and the measuring current $I_{S2}$ through transistor $T_4$ decreases. Consequently, voltage across the base-emitter junction of transistor $T_7$ increases and the voltage across the base-emitter junction of transistor $T_8$ decreases. At already relatively small currents transistor $T_5$ will therefore be turned off so that transistor $T_6$ will behave as an emitter follower. The voltage at the common point 8 thus increases so that transistors $T_{15}$ and $T_{16}$ will convey less current and transistors $T_{13}$ and $T_{14}$ will convey more current. The base current of both transistor $T_1$ and of transistor $T_2$ consequently increases. In this way the measuring current $I_{S2}$ and consequently the quiescent current through transistor $T_2$ is controlled to a well-defined residual value independent of the extent to which transistor $T_1$ is turned on. When driving transistor $T_2$ the quiescent current through transistor $T_1$ is similarly controlled to the same residual value.

When ignoring the base currents of the transistors $T_1$ and $T_2$ it follows from equation 8 that the currents $I_1$ and $I_2$ are determined by the following equation:

$$\frac{2I_1 \cdot I_2}{I_1 + I_2} = N \cdot I_0 \qquad (11)$$

Figure 2:
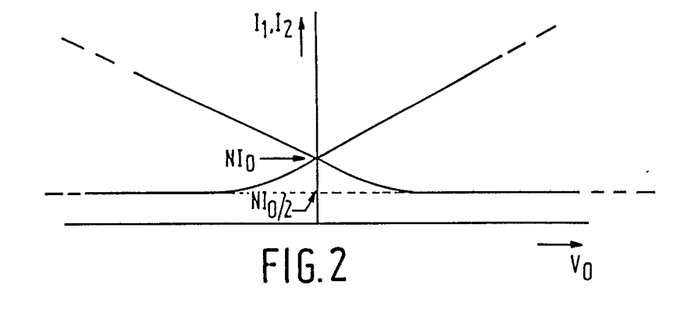
FIG. 2 shows the waveforms of the currents through the output transistors as a function of the output voltage of the amplifier.

It is apparent from the above-mentioned equation that the control circuit 40 controls the harmonic mean value of the currents through the transistors $T_1$ and $T_2$ to a value which is equal to a reference value. FIG. 2 shows the waveform of the currents $I_1$ and $I_2$ through the transistors $T_1$ and $T_2$ as a function of the voltage $V_{out}$ at the output 3 of the amplifier arrangement. As is apparent from this Figure, the residual current of the non-driven output transistor is each time controlled to a constant value It follows from equation 11 that this residual current is given by:

$$I_r = \frac{NI_0}{2} \qquad (12)$$

In this embodiment the residual current is thus equal to half the quiescent current in the absence of an input signal. Due to this residual current the non-driven transistor is each time partly turned on and is prevented from being turned off. Consequently the cross-over distortion is reduced. Since the base-emitter voltage variations of the output transistors are small, the distortion caused thereby is also small. Since the first output transistor $T_1$ is always turned on, the variation of the output impedance of this transistor and hence of the total amplifier arrangement is small so that the distortion of the output signal caused thereby is also small. Moreover, the dissipation in the non-driven output transistor is substantially constant because the residual current flowing therethrough is accurately fixed and is substantially constant. It is to be noted that the harmonic means value of the currents through the output transistors and hence the residual current can be controlled to a different value in the case of a different choice of the ratio of the emitter surfaces and/or bias currents.

Figure 3:
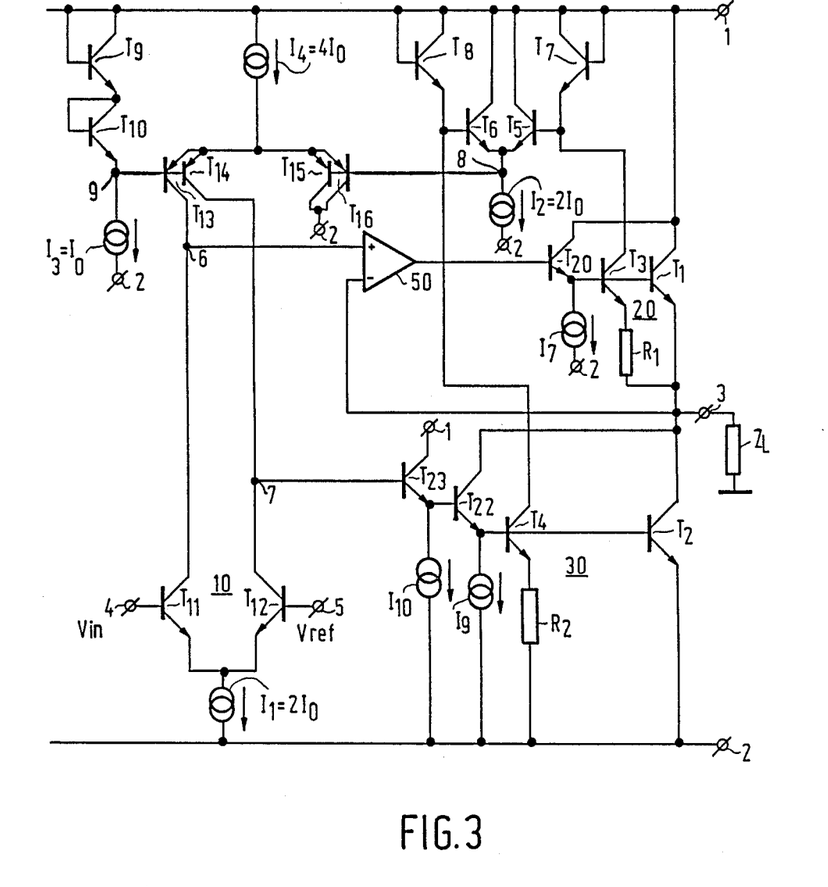
FIG. 3 shows a second embodiment of an amplifier arrangement according to the invention.

FIG. 3 shows a second embodiment of an amplifier arrangement according to the invention in which the same components have the same reference numerals as in FIG. 1. The output transistors $T_1$ is arranged in a Darlington configuration with a transistor $T_{20}$, whilst the collector is connected to the collector of transistor $T_1$ and the emitter is connected to the base of transistor $T_1$ and to the second power supply terminal 2 by means of a current source $I_7$. The base of transistor $T_{20}$ is connected to the first output 6 of the drive means 10. Similarly transistor $T_2$ is arranged in a Darlington configuration with a transistor $T_{22}$, whilst the emitter of transistor $T_{22}$ is connected to the second power supply terminal 2 by means of a current source $I_9$. The base of transistor $T_{22}$ is driven by a voltage follower with a transistor $T_{23}$ and a current source $I_{10}$. The base of transistor $T_{23}$ is connected to the second output 7 of the drive means 10.

The Darlington configurations $T_1$, $T_{20}$ and $T_2$, $T_{22}$ ensure a very large current gain and consequently very small base currents in the transistors $T_{20}$ and $T_{21}$.

In the embodiment of FIG. 3 the first output 6 of the drive means is connected to the non-inverting input of an amplifier 50 whose inverting output is connected to the output 3 of the amplifier arrangement. The output of the amplifier 50 is connected to the base of transistor $T_{20}$. The amplifier 50 ensures a negative feedback around the Darlington configuration $T_1$, $T_{20}$. This results in the distortion of the output voltage due to non-linearities of the output transistor $T_1$ being eliminated, so that the voltage $V_0$ at the output 3 very accurately follows the voltage at the output 6 of the drive means 10.

Figure 4:
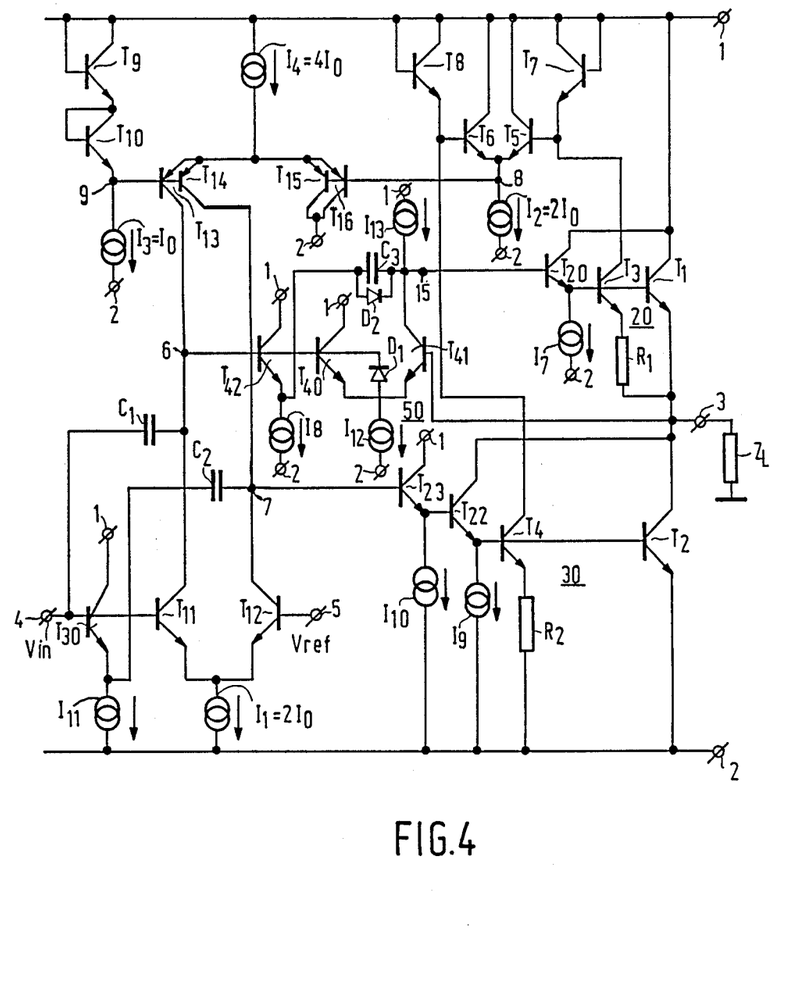
FIG. 4 shows a third embodiment of an amplifier arrangement according to the invention.

FIG. 4 shows a third embodiment of an amplifier arrangement according to the invention in which the same components have the same reference numerals as in FIG. 3. A frequency compensation capacitor $C_1$ which, as is known, stabilizes the gain if the amplifier arrangement is driven by a conventional input amplifier, is arranged between the input 4 of the amplifier arrangement and the first output 6 of the drive means 10. The input 4 is also connected to the base of a transistor $T_{30}$ whose collector is connected to the power supply terminal 1 and whose emitter is connected to the power supply terminal 2 by means of a current source $I_{11}$ and to the second output 7 of the drive means 10 by means of a capacitor $C_2$. The capacitor $C_2$ ensures that the input voltage $V_{in}$ is directly applied to the base of transistor $T_{23}$ via voltage follower transistor $T_{30}$ in the case of high frequencies.

In this embodiment the amplifier 50 is constituted by a differential amplifier having two transistors $T_{40}$, $T_{41}$ whose emitters are connected to a common point which is connected to the power supply terminal 2 via a current source $I_{12}$. The base of transistor $T_{40}$ is connected to the first output 6 of the drive means 10 and the base of transistor $T_{41}$ is connected to the output 3 of the amplifier arrangement. The collector of transistor $T_{40}$ is directly connected to the power supply terminal 1 and the collector of transistor $T_{41}$ is connected to the positive power supply terminal 1 by means of a current source $I_{13}$ and to an output 15 of the amplifier 30. This output 15 is connected to the base of transistor $T_{20}$. The first output 6 of the drive means 10 is also connected to the base of a transistor $T_{42}$ whose collector is connected to the first power supply terminal 1 and whose emitter is connected to the second power supply terminal 2 by means of a current source $I_8$ and to the output 15 of amplifier 30 by means of a capacitor $C_3$. In the region where amplifier 50 exhibits a large phase shift capacitor $C_3$ ensures that the signal at the first output 6 is directly applied to the base of transistor $T_{20}$. A first diode $D_1$ is arranged between the base and the emitter of transistor $T_{40}$ and a second diode $D_2$ is arranged parallel to capacitor $C_3$. These diodes prevent the amplifier $T_{40}$, $T_{41}$ from being overdriven in the frequency range in which both negative feedback and positive feedback occurs.

Figure 5:
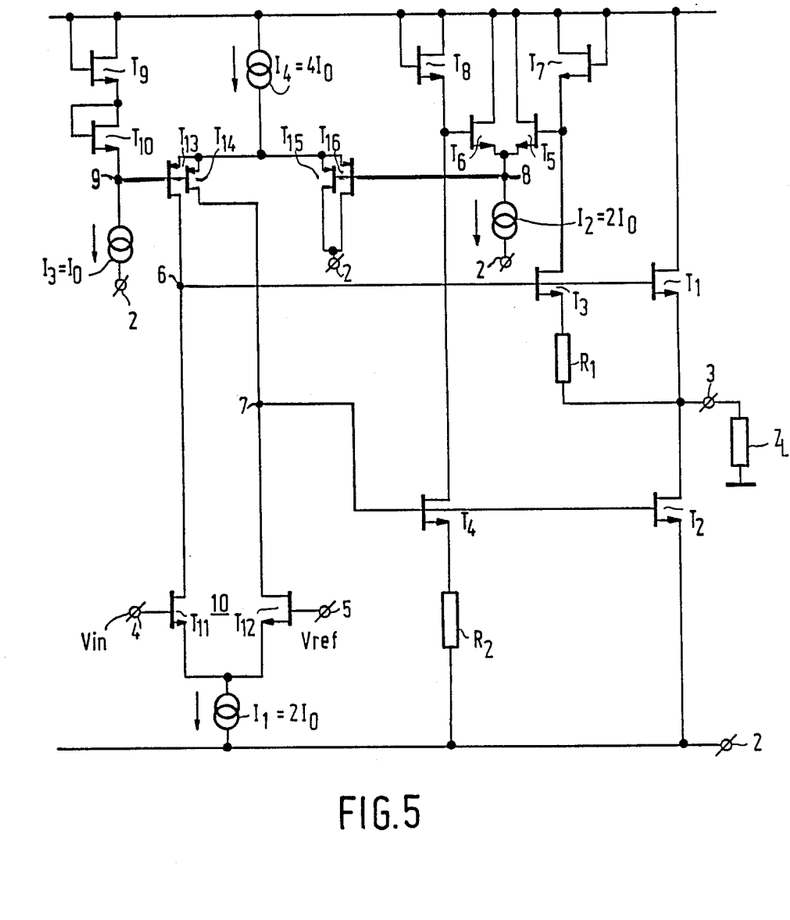
FIG. 5 shows a fourth embodiment of an amplifier arrangement according to the invention.

FIG. 5 shows a fourth embodiment of an amplifier arrangement according to the invention in which the same components have the same reference numerals as in FIG. 1. The arrangement now comprises field effect transistors instead of bipolar transistors.

In the control circuit 40 two translinear loops can be distinguished again. For the first loop with transistors $T_5$–$T_{10}$ the following equation holds;

$$V_{GST7} + V_{GST5} = V_{GST6} + V_{GST8} \tag{13}$$

in which $V_{GS}$ is the gate-source voltage of the relevant transistor.

For the second loop with transistors $T_8$, $T_6$, $T_{16}$, $T_{13}$, $T_{10}$ and $T_9$ the following equation holds:

$$V_{GST8} + V_{GST6} + V_{GST13} = V_{GST9} + V_{GST10} + V_{GST16} \tag{14}$$

With the known equations for the relationship between the drain-source current and the gate-source voltage of a field effect transistor an equation which is equal to equation 11 can be derived from the equations 13 and 14, which shows that also in the case of field effect transistors the control circuit 40 controls the harmonic means value of the output transistors each time to a constant value.

The invention is not limited to the embodiments shown. The first and the second current measuring means may be constituted in any other way, provided that they generate a current which is a measure of the current flowing through the first and the second output transistor. The drive means may also be constituted in any other way, provided that they drive the first and the second output transistor in a push-pull mode. The control circuit may also be constituted in any other way, provided that the circuit controls the harmonic mean value of the currents flowing through the two output transistors to a reference value. The embodiments of the amplifier arrangement according to the invention are either completely built up with bipolar transistors or are completely built up with unipolar transistors. It is of course also possible to build up the amplifier arrangement with both unipolar and bipolar transistors.

What is claimed is:

1. An amplifier arrangement comprising:

a first and a second output transistor of the same conductivity type, each having a first main terminal, a second main terminal and a control terminal, the first and the second main terminal of the first output transistor being coupled to a first power supply terminal and an output for connecting a load, and the first and the second main terminal of the second transistor being coupled to the output and a second power supply terminal, drive means for driving the first and the second transistor in phase opposition, said drive means having a first input for applying an input signal, a second input, a first output which is coupled to the control terminal of the first transistor and to a power supply terminal by means of a first current source, and a second output which is coupled to the control terminal of the second transistor and to the power supply terminal by means of a second current source, quiescent current means for causing a quiescent current to flow through the first and the second output transistor, said quiescent current means having first and second current measuring means for generating a first and a second meansuring current which is a measure of the current flowing through the first and the second output transistor, respectively, and having feedback means for controlling the quiescent current flowing through the first and the second output transistor by way of the first and the second measuring current, characterized in that the second input of the drive means is coupled to a point for conveying a reference potential and the negative feedback means are provided with a control circuit for controlling the current intensities of the first and second current source in order to render the harmonic mean value of the first and the measuring current substantially equal to a reference value.

2. An amplifier arrangement as claimed in claim 1, characterized in that the control circuit comprises:

a first differential amplifier having a third and a fourth transistor of the first conductivity type, each having a first main terminal, a second main terminal and a control terminal, the second main terminals being coupled to a common point which is coupled to the second power supply terminal by means of a third current source, the control terminal of the third transistor being coupled to the first power supply terminal by means of a first diode and to a first input for applying the first measuring current, and the control terminal of the fourth transistor being coupled to the first power supply terminal by means of a second diode and to a second input for applying the second measuring current, a reference circuit having a fourth current source which is coupled to the first power supply terminal by means of a third and a fourth diode and a second differential amplifier having a fifth and a sixth transistor of a second conductivity type, each having two first main terminals, at least one second main terminal and a control terminal, the control terminal of the fifth transistor being coupled to the third current source and the control terminal of the sixth transistor being coupled to the common point of the first differential amplifier, the two first main terminals of the fifth transistor constituting outputs of the first and the second current source.

3. An amplifier arrangement as claimed in claim 1, characterized in that the first current measuring means include a seventh transistor having a first main terminal, a second main terminal and a control terminal, the control terminal and the second main terminal being coupled to the control terminal and the second main terminal, respectively, of the first transistor and in that the second current measuring means include an eighth transistor having a first main terminal, a second main terminal and a control terminal, the control terminal and the second main terminal being coupled to the control terminal and the second main terminal, respectively, of the second output transistor.

4. An amplifier arrangement as claimed in claim 3, characterized in that the second main terminal of the seventh transistor is coupled to the second main terminal of the first transistor by means of a first resistor and in that the second main terminal of the eighth transistor is coupled to the second main terminal of the second transistor by means of a second resistor.

5. An amplifier arrangement as claimed in claim 1, characterized in that the drive means include a third differential amplifier having a ninth and a tenth transistor each having a first main terminal, a second main terminal and a control terminal, the control terminal and the first main terminal of the ninth transistor being coupled to the first input and the first output, respectively, of the drive means and the control terminal and the second main terminal of the tenth transistor being coupled to the second input and the second output, respectively, of the drive means.

6. An amplifier arrangement as claimed in claim 5, characterized in that a first capacitor is arranged between the first input and the first output of the drive means.

7. An amplifier arrangement as claimed in claim 5, characterized in that the first input of the drive means is coupled to an input of an eleventh transistor arranged as a voltage follower, an output of which is coupled to the second output of the drive means by means of a second capacitor.

8. An amplifier arrangement as claimed in claim 1, characterized in that the first output of the drive means is coupled to a non-inverting input of an amplifier an inverting input of which is coupled to the output of the amplifier arrangement and an output of which is coupled to the control terminal of the first output transistor.

9. An amplifier arrangement as claimed in claim 8, characterized in that the amplifier is constituted by a fourth differential amplifier having a twelfth and a thirteenth transistor of the first conductivity type, each having a control terminal and a first and a second main terminal, the control terminal of the twelfth transistor being coupled to the non-inverting input and the control terminal of the thirteenth transistor being coupled to the inverting input, the first main terminal of the thirteenth transistor being coupled to the output of the amplifier and to the first power supply terminal by means of a current source.

10. An amplifier arrangement as claimed in claim 8, characterized in that the first output of the drive means is coupled to an input of a transistor arranged as a voltage follower, an output of which is coupled to the control terminal of the first output transistor by means of a third capacitor.

11. An amplifier arrangement as claimed in claim 10, characterized in that a fifth diode is arranged in parallel with the third capacitor and in that a sixth diode is arranged between the second main terminal and the control terminal of the twelfth transistor.

* * * * *